United States Patent
Yuasa et al.

(10) Patent No.: US 11,483,926 B2
(45) Date of Patent: Oct. 25, 2022

(54) CERAMIC CIRCUIT BOARD AND PRODUCTION METHOD THEREFOR

(71) Applicant: DENKA COMPANY LIMITED, Tokyo (JP)

(72) Inventors: Akimasa Yuasa, Omuta (JP); Yusaku Harada, Omuta (JP); Takahiro Nakamura, Omuta (JP); Shuhei Morita, Omuta (JP); Kouji Nishimura, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 287 days.

(21) Appl. No.: 16/630,232

(22) PCT Filed: Jul. 25, 2018

(86) PCT No.: PCT/JP2018/027882
§ 371 (c)(1),
(2) Date: Jan. 10, 2020

(87) PCT Pub. No.: WO2019/022133
PCT Pub. Date: Jan. 31, 2019

(65) Prior Publication Data
US 2020/0163210 A1 May 21, 2020

(30) Foreign Application Priority Data
Jul. 25, 2017 (JP) ............................. JP2017-143417

(51) Int. Cl.
*H05K 1/03* (2006.01)
*H05K 1/02* (2006.01)
(Continued)

(52) U.S. Cl.
CPC ......... *H05K 1/0306* (2013.01); *C04B 37/006* (2013.01); *H05K 3/102* (2013.01); *H05K 1/0271* (2013.01)

(58) Field of Classification Search
CPC .... H05K 1/0206; H05K 3/102; H05K 1/0271; C04B 37/006; C04B 37/02; C04B 37/026; C04B 2237/125; H01L 23/3735
See application file for complete search history.

(56) References Cited

U.S. PATENT DOCUMENTS 5,277,942 A * 1/1994 Ikegaya ............... G21B 1/13
428/332
8,785,785 B2 7/2014 Kato
(Continued)

FOREIGN PATENT DOCUMENTS

EP 3 125 286 A1 2/2017
JP H10326949 A 12/1998
(Continued)

OTHER PUBLICATIONS

Jun. 22, 2020 Extended Search Report issued in European Patent Application No. 18839092.6.
(Continued)

*Primary Examiner* — Alex B Efta
(74) *Attorney, Agent, or Firm* — Oliff PLC (57) ABSTRACT

A ceramic circuit substrate having high bonding performance and excellent thermal cycling resistance properties, having a circuit pattern provided on a ceramic substrate with a braze material layer interposed therebetween, and a protruding portion formed by the braze material layer protruding from the outer edge of the circuit pattern, wherein: the braze material layer includes Ag, Cu, Ti, and Sn or In; and an Ag-rich phase is formed continuously for 300 μm or more, towards the inside, from an outer edge of the protruding portion, along a bonding interface between the
(Continued)

ceramic substrate and the circuit pattern, and has a bonding void ratio of 1.0% or less.

8 Claims, 2 Drawing Sheets

(51) Int. Cl.
*H05K 3/10* (2006.01)
*C04B 37/00* (2006.01)
*C04B 37/02* (2006.01)

(56) References Cited

U.S. PATENT DOCUMENTS

| | | | |
|---|---|---|---|
| 2003/0068532 | A1 | 4/2003 | Tsukaguchi et al. |
| 2004/0262367 | A1 | 12/2004 | Nakamura |
| 2012/0168209 | A1 | 7/2012 | Kato |
| 2014/0126155 | A1* | 5/2014 | Imamura .................. C22C 5/08 361/715 |
| 2018/0005918 | A1* | 1/2018 | Naba ..................... H05K 1/0271 |

FOREIGN PATENT DOCUMENTS

| | | | |
|---|---|---|---|
| JP | 2003-112980 | A | 4/2003 |
| JP | 2005112677 | A * | 4/2005 |
| JP | 2005-268821 | A | 9/2005 |
| JP | 2009-256207 | A | 11/2009 |
| JP | 2016-165001 | A | 9/2016 |
| WO | 2013/002407 | A1 | 1/2013 |
| WO | 2017/056360 | A1 | 4/2017 |

OTHER PUBLICATIONS

Sep. 11, 2018 International Search Report issued in International Patent Application No. PCT/JP2018/027882.

* cited by examiner

CERAMIC CIRCUIT BOARD AND PRODUCTION METHOD THEREFOR

TECHNICAL FIELD

The present invention relates to a ceramic circuit substrate and a production method therefor.

BACKGROUND ART

In power module applications such as elevators, vehicles, and hybrid cars, ceramic circuit substrates are used. These ceramic circuit substrates have a metal circuit board bonded, with a braze material, to the surface of a ceramic substrate composed of a ceramic such as alumina, beryllia, silicon nitride, or aluminum nitride, and have semiconductor elements further mounted at prescribed positions on the metal circuit board.

In recent years, with the higher outputs and higher integration of semiconductor elements, the amount of heat generated by semiconductor elements has been steadily increasing. In order to efficiently disperse this generated heat, ceramic substrates that are highly insulating, highly thermal conductive aluminum nitride sintered bodies, or silicon nitride sintered bodies are used.

However, there is a large difference between the thermal expansion coefficients of ceramic substrates and metal plates, and the load from repeated hot-cold cycles generates thermal stress caused by the differences in the thermal expansion coefficients at the bonding interfaces between the ceramic substrates and the metal plates. In particular, residual stress due to compression and tension acts on the ceramic substrate near the bonded portion, thus forming cracks in the ceramic substrate, leading to bonding defects or thermal resistance defects, and causing problems such as reduced operational reliability as an electronic device.

Here, Patent Document 1 proposes a structure which improves the thermal cycling properties of a ceramic circuit substrate by controlling the length of a braze material that protrudes from the bottom surface of a metal plate so as to be longer than 30 μm and no more than 250 μm, and preferably 50 μm to 200 μm.

Patent Document 2 proposes a method for controlling the structure of a portion protruding from a braze material layer of a ceramic circuit substrate so that Ag-rich phases occupy a larger area therein than do Cu-rich phases, thereby suppressing dissolution of the braze material protruding portion due to etching and preventing stress relaxation effects of the braze material layer protruding portion from decreasing.

Patent Document 3 proposes a method for controlling the thickness and length of a braze material layer so as to be caused to protrude at a fixed ratio, thereby improving the thermal cycling properties of a ceramic circuit substrate.

CITATION LIST

Patent Literature

Patent Document 1: JP 2003-112980 A
Patent Document 2: JP 2005-268821 A
Patent Document 3: WO 2107/056360 A

SUMMARY OF INVENTION

Technical Problem

In power modules mounted in recent electric vehicles, higher power outputs and higher integration are rapidly progressing even further, and the thermal stress placed on ceramic circuit substrates tends to increase more and more. For this reason, in order to ensure functional safety, thermal cycling tests formerly involved one cycle being a cycle for increasing/decreasing the temperature from cooling at −40° C. for 15 minutes, keeping at room temperature for 15 minutes, heating at 125° C. for 15 minutes, and keeping at room temperature for 15 minutes. From these tests, endurance properties are demanded under harsh thermal cycling conditions wherein one cycle has now changed to a cycle for increasing/decreasing the temperature from cooling at −55° C. for 15 minutes, keeping at room temperature for 15 minutes, heating at 175° C. for 15 minutes, and keeping at room temperature for 15 minutes. In particular, by lowering the cooling temperature, there is a problem in that the tensile stress generated in the ceramic portion increases and cracks form more readily in the ceramic circuit substrate. On this point, by controlling the length, distance, ratio, and structure of the braze material layer protruding portion disclosed in Patent Document 1, Patent Document 2, and Patent Document 3, thermal stress relaxation effects can be expected. However, under the harsher thermal cycling test conditions, greater thermal stress concentrates in the braze material layer protruding portion under an outer edge of the copper circuit pattern portion, and there may be cases of breaking at the interface between Ag-rich phases and Cu-rich phases near the base of the braze material protruding portion. In these cases, there are problems in that the braze material protruding portion becomes shorter, it is not possible to obtain stress relaxation effects, and cracks occur in the ceramic circuit substrate.

The present invention addresses the problem of providing a ceramic circuit substrate having high bonding properties and excellent thermal cycling resistance properties, and a production method therefor.

Solution to Problem

The present inventors performed diligent investigations in order to achieve the objective mentioned above. As a result thereof, it was discovered that by making Ag-rich phases continuous on the circuit pattern side from the outer edge of the braze material protruding portion of the ceramic circuit substrate and reducing interfaces between Ag-rich phases and Cu-rich phases, the thermal cycling resistance properties of the ceramic circuit substrate improves. The present invention was completed on the basis of these discoveries.

In other words, the present invention relates to the following.

1. A ceramic circuit substrate having a circuit pattern provided on a ceramic substrate with a brazing material layer interposed therebetween, and a protruding portion formed by the braze material layer protruding from the outer edge of the circuit pattern, wherein: the braze material layer comprises Ag, Cu, Ti, and Sn or In; and Ag-rich phases are formed continuously for 300 μm or more, towards the inside, from an outer edge of the protruding portion, along a bonding interface between the ceramic substrate and the circuit pattern, and the bonding void ratio is 1.0% or less.
2. The ceramic circuit substrate described in 1, wherein the thickness of the protruding portion is 8 μm to 30 μm and the length thereof is 40 μm to 150 μm.
3. The ceramic circuit substrate described in 1 or 2, wherein the ceramic substrate is selected from silicon nitride, aluminum nitride, aluminum oxide, zirconium oxide, silicon carbide, and lanthanum boride.

4. The ceramic circuit substrate described in any one of 1 to 3, wherein the circuit pattern comprises copper.
5. A production method for the ceramic circuit substrate described in any one of 1 to 4, wherein: the production method comprises a step for bonding, using a braze material, a copper plate to both main surfaces of the ceramic substrate; the braze material contains 85.0 to 95.0 parts by mass of Ag, 5.0 to 13.0 parts by mass of Cu, 0.4 to 2.0 parts by mass of Sn or In, and 1.5 to 5.0 parts by mass of Ti with respect to 100 parts by mass, in total, of the Ag, Cu, and Si or In; and the bonding is carried out in a vacuum or an inert atmosphere, at a bonding temperature of 770° C. to 900° C. and for a retention time of 10 to 60 minutes.
6. The method described in 5, wherein the braze material comprises Ag powder, Cu powder, and Sn powder or In powder, and the specific surface area of the Ag powder is 0.1 to 0.6 m$^2$/g.
7. The production method described in 5 or 6, wherein the Cu powder has a surface area of 0.1 to 1.0 m$^2$/g and an average particle diameter D50 of 0.8 to 8.0 μm.
8. The production method described in any one of 5 to 7, wherein the Sn powder or the In powder has a specific surface are of 0.1 to 1.0 m$^2$/g and an average particle diameter D50 of 0.8 to 10.0 μm.

Advantageous Effects of Invention

According to the present invention, it is possible to provide a ceramic circuit substrate having high bonding properties and excellent thermal cycling resistance properties, and a production method therefor. More specifically, it is possible to provide: a ceramic circuit substrate in which the bond void ratio is 1.0% or less and the crack ratio after 2,500 cycles in thermal cycling tests from −55° C. to 175° C. is less than 2.0%; and a production method therefor.

DESCRIPTION OF EMBODIMENTS

One embodiment of the present invention is described in detail below. The present invention is not limited to the embodiment below and may be implemented by making changes, as appropriate, in a scope not hindering the effects of the present invention.

[Ceramic Circuit Substrate]

The ceramic circuit substrate according to the present embodiment is a ceramic circuit substrate that has, in a bonding interface of a cross section of the ceramic circuit substrate where a protruding portion is formed by a braze material layer that comprises Ag, Cu, Ti, and Sn or In and protrudes from the outer edge of a circuit pattern, Ag-rich phases that are continuous for 300 μm or more, towards the inside of the circuit pattern, from the outer edge of the protruding portion formed by the braze material layer, and a bonding void ratio of 1.0% or less. A detailed description follows.

(Ceramic Substrate)

The ceramic circuit substrate has a circuit pattern provided on a ceramic substrate with a braze material layer interposed therebetween. The ceramic substrate according to the embodiment is not particularly limited, and it is possible to use a nitride ceramic such as silicon nitride or aluminum nitride, an oxide ceramic such as aluminum oxide or zirconium oxide, a carbide ceramic such as silicon carbide, or a boride ceramic such as lanthanum boride. However, a non-oxide ceramic such as aluminum nitride or silicon nitride is favorable for bonding a metal plate to a ceramic substrate by an active metal method, and furthermore, a silicon nitride substrate is preferable from the perspective of excellent mechanical strength and fracture toughness.

The thickness of the ceramic substrate is not particularly limited, but is generally about 0.1 to 3.0 mm. In particular, considering the heat dissipation properties and the decrease in the thermal resistance of the circuit substrate overall, the thickness is preferably 0.2 to 1.2 mm or less, and more preferably 0.25 to 1.0 mm or less.

(Braze Material Layer)

In order to achieve excellent thermal cycling resistance properties in the ceramic circuit substrate, the braze material layer is configured from a material comprising Ag, Cu, Ti, and Sn or In. The braze material may be formed by using Ag powder, Cu powder, and Sn powder or In powder. By increasing the blend ratio of the Ag powder so that the braze material blend Ag/Cu ratio is higher than 72 mass %:28 mass %, which is a eutectic composition of Ag and Cu, it is possible to prevent Cu-rich phases from becoming coarse and to form a braze material layer structure in which an Ag-rich layer is continuous. Further, if the blend amount of Ag powder is large and the blend amount of Cu powder is small, the Ag powder does not completely dissolve during bonding and remains as bonding voids. Furthermore, the Sn or In contained in the braze material powder is a component for making the contact angle of the braze material with respect to the ceramic substrate smaller, and improving the wettability of the braze material. If the content thereof is too low, the wettability with respect to the ceramic substrate can decrease and lead to bonding defects, and if the content thereof is too high, Ag-rich phases in the braze material layer may be rendered non-continuous due to Cu-rich phases, this may become an origin of breaking in the braze material, and there is a possibility of the thermal cycling properties of the ceramic circuit substrate being reduced.

As such, the blend ratios of the Ag powder, the Cu powder, and the Sn powder or the In powder are: 85.0 to 95.0 parts by mass, preferably 88.0 to 92.0 parts by mass, and more preferably 88.5 to 91.0 parts by mass of Ag powder; 5.0 to 13.0 parts by mass, preferably 6.0 to 12.0 parts by mass, and more preferably 7.0 to 11.0 parts by mass of Cu powder; and 0.4 to 2.0 parts by mass, and preferably 0.5 to 1.5 parts by mass of Sn powder or In powder.

An Ag powder having a specific surface area of 0.1 to 0.6 m$^2$/g, and preferably 0.3 to 0.5 m$^2$/g, may be used as the Ag powder. By setting the specific surface area to be 0.6 m$^2$/g or less, it is possible to prevent the occurrence of aggregates and oxidation concentration from becoming high, which occur due to using an Ag powder having a large specific surface area. It is thus possible to prevent the generation of bonding defects. Further, by setting the specific surface area to be 0.1 m$^2$/g or more, it is possible to suppress the formation of bonding voids in the ceramic circuit substrate due to Ag powder not completely dissolving, which occurs due to using an Ag powder having a small specific surface area. As a result thereof, it is possible to configure a ceramic circuit substrate having higher bonding properties. The specific surface area can be measured by using a gas adsorption method. Regarding the method for producing the Ag powder, powders produced by an atomization process or a wet reduction process are common. The average particle diameter D50, in a number-based particle size distribution measured using laser diffraction, of the Ag powder is preferably 1.0 to 10.0 µm, and more preferably 2.0 to 4.0 µm.

In order to make the Ag-rich phases continuous, for the Cu powder contained in the braze material powder described above, a Cu powder having a specific surface area of 0.1 to 1.0 $m^2/g$, preferably 0.2 to 0.5 $m^2/g$, and/or an average particle diameter D50, in a volume-based particle size distribution measured using laser diffraction, of 0.8 to 8.0 µm, and preferably 2.0 to 4.0 µm may be used. By setting the specific surface area to be 1.0 $m^2/g$ or less, or the average particle diameter D50 to be 0.8 µm or more, it is possible to prevent the oxygen amount in the Cu powder from becoming high, which occurs due to using a fine Cu powder, and it is, thereby, possible to prevent the generation of bonding defects. Further, by setting the specific surface area to be 0.1 $m^2/g$ or more, or the average particle diameter D50 to be 8.0 µm or less, it is possible to prevent the Ag-rich phases of the braze material layer from being rendered non-continuous by Cu-rich phases, which occurs due to using a large Cu powder. As a result thereof, it is possible to keep places where the Ag-rich phases have been rendered non-continuous from becoming an origin of breaking in the braze material and thereby lowering the thermal cycling properties of the ceramic circuit substrate, and it is possible to configure a ceramic circuit substrate having more excellent thermal cycling resistance properties.

As the Sn powder or In powder described above, a powder having a specific surface area of 0.1 to 1.0 $m^2/g$ and/or an average particle diameter D50 of 0.8 to 10.0 µm may be used. By setting the specific surface area to be 1.0 $m^2/g$ or less, or the average particle diameter D50 to be 0.8 µm or more, it is possible to prevent the oxygen amount in the Sn powder from becoming high, which occurs due to using a fine powder, and it is thus possible to prevent the generation of bonding defects. Further, by setting the specific surface are to be 0.1 $m^2/g$ or more, or the average particle diameter D50 to be 8.0 µm or more, it is possible to prevent the Sn powder or In powder from dissolving in the Ag powder during heating in the bonding step, which occurs due to using a large Si powder or In powder, and thereby generating coarse bonding voids in portions where the Sn powder or In powder is present. As a result thereof, it is possible to configure a ceramic circuit substrate having higher bonding properties. The abovementioned specific surface area is a value measured using a gas adsorption method.

In the present embodiment, titanium is used as the active metal added to the braze material blend mentioned above for its high reactivity with aluminum nitride substrates and silicon nitride substrates, and for its ability to make the bonding strength extremely high. The added amount of Ti with respect to 100 parts by mass, in total, of the Ag powder, the Cu powder, and the Si powder or In powder is preferably 1.5 to 5.0 parts by mass, and more preferably 2.0 to 4.0 parts by mass. By setting the active metal content to be 1.5 parts by mass or more, the wettability between the ceramic substrate and the braze material is increased and the occurrence of bonding defects can be further suppressed. By setting the content of Ti to be 5.0 parts by mass or less, it is possible to prevent the thermal cycling properties of the ceramic circuit substrate from being reduced due to the Ag-rich phases being rendered non-continuous and becoming an origin of breaking in the braze material layer, which occurs due to a large amount of unreacted Ti remaining. As a result thereof, thermal cycling properties can be further enhanced.

A preferred method for mixing the braze material raw materials is blending the metal powders, an organic solvent, and a binder, and rendering to a paste by mixing using a grinding mixer, a planetary centrifugal mixer, a planetary mixer, a three-roll mill, or the like. Generally, methyl cellosolve, ethyl cellosolve, isophorone, toluene, ethyl acetate, terpineol, diethylene glycol monobutyl ether, texanol, and the like, are used as the organic solvent, and a polymerized compound such as polyisobutyl methacrylate, ethyl cellulose, methyl cellulose, or an acrylic resin, etc. is used as the binder.

A roll coating method, a screen printing method, or a transfer method, etc., may be used as a method for coating both surfaces of the ceramic substrate with the braze material paste, but in order to coat the braze material uniformly, a screen printing method is preferred. In the screen printing method, in order to coat the braze material paste uniformly, it is preferable to control the viscosity of the braze material paste to be 5 to 20 Pa·s. By blending 5 to 17 mass % of an organic solvent and 2 to 8 mass % of a binder in the braze material paste, it is possible to obtain a braze material paste having excellent printability.

(Circuit Pattern)

The circuit pattern is not particularly limited and may be formed from a copper plate, for example. Pure copper is preferable as the material used in the copper plate. The thickness of the copper plate is not particularly limited, but is generally 0.1 to 1.5 mm. In particular, in view of the heat dissipation properties, the thickness is preferably 0.3 mm or more, and more preferably 0.5 mm or more.

The circuit pattern may be formed, after bonding the metal plate (for example, a copper plate) on the ceramic substrate using the braze material, by forming an etching mask and carrying out an etching process.

The bonding between the ceramic substrate and the metal plate preferably involves bonding in a vacuum or an inert atmosphere such as nitrogen or argon at a temperature of 770 to 900° C. and for a time of 10 to 60 minutes, and more preferably bonding at a temperature of 790 to 900° C. and for a time of 10 to 60 minutes. Further, bonding at a temperature of 770 to 900° C. and for a time of 10 to 40 minutes is also preferred. Bonding may also be performed at a temperature of 775 to 820° C. and for a time of 10 to 30 minutes. By setting the bonding temperature to be 770° C. or higher and the retention time to be 10 minutes or longer, it is possible to prevent the melt-in of Cu from the metal plate from being insufficient and it is possible to increase the bonding properties of the ceramic substrate with the metal plate. Further, by setting the bonding temperature to be 900° C. or lower and the retention time to be 60 minutes or shorter, it is possible to enhance the continuity of the Ag-rich phases and it is also possible to prevent thermal stress caused by the thermal expansion coefficient difference at the time of bonding from increasing, and thus the reliability of the ceramic circuit substrate can be further improved.

As the method for forming an etching mask for forming a circuit pattern on the circuit substrate, it is possible to employ a general process such as a photographic development method (photo resist method), a screen printing method, or an inkjet printing method.

An etching process is carried out on the copper plate in order to form a circuit pattern. There are also no particular restrictions on the etching solution, and for the etching solution used to etch the copper circuit, it is possible to use a commonly used ferric chloride solution or cupric chloride solution, sulfuric acid, hydrogen peroxide water, or the like, among which a ferric chloride solution and a cupric chloride solution are preferred. By adjusting the etching time, side surfaces of the copper circuit may also be inclined.

A ceramic circuit substrate from which unnecessary copper circuit portions have been removed by etching has the coated braze material, and alloy layers, nitride layers, and the like thereof still remaining, and it is common to remove these by using a solution containing an aqueous ammonium halide solution, an inorganic acid such as sulfuric acid or nitric acid, or hydrogen peroxide water. By adjusting conditions such as etching time, temperature, and spray pressure, it is possible to adjust the length and thickness of the braze material protruding portion.

The method for stripping the etching mask after circuit formation is not particularly limited and a method of immersion in an alkaline aqueous solution is common.

In order to improve the weatherability of the copper plate constituting the circuit pattern on the surface of the ceramic bonded circuit substrate and also to prevent changes over time such as solder wettability, etc., it is preferable to perform Ni plating, Ni alloy plating, Au plating, or an anti-corrosion treatment. After performing, for example, degreasing, chemical polishing, and a pre-treatment step using a Pd-activated chemical solution, the plating step is carried out using a method of normal electroless plating using a chemical solution containing hypophosphite as an Ni—P electroless plating solution or a method for electroplating by causing an electrode to come into contact with the pattern. It is preferable for an anti-corrosion treatment to be carried out using a benzotriazole-based compound.

(Protruding Portion)

Figure 1:
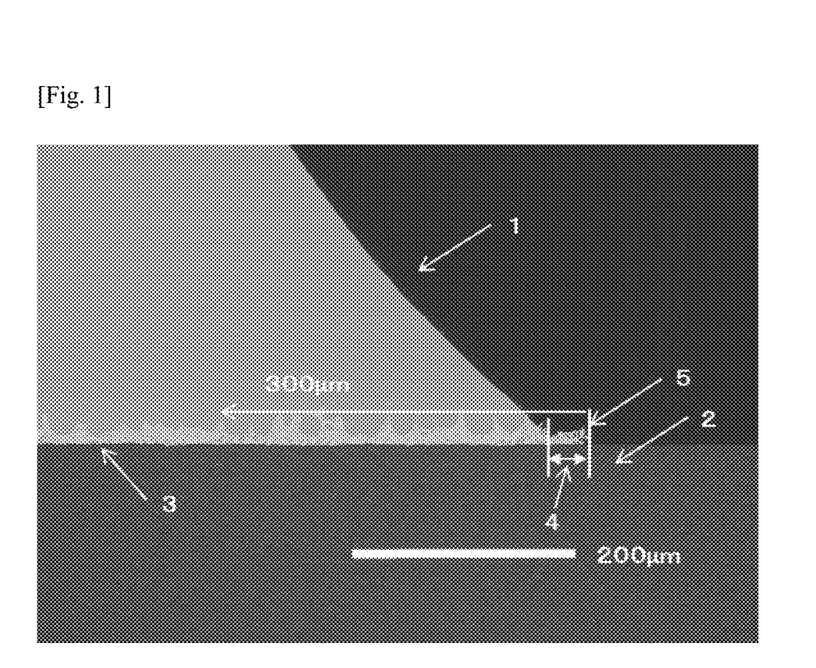
FIG. 1 shows an example of a cross-sectional photograph of a ceramic circuit substrate in which Ag-rich phases are continuous for 300 μm or more, towards the inside of a circuit pattern, from an outer edge of a protruding portion formed by a braze material layer.
Figure 2:
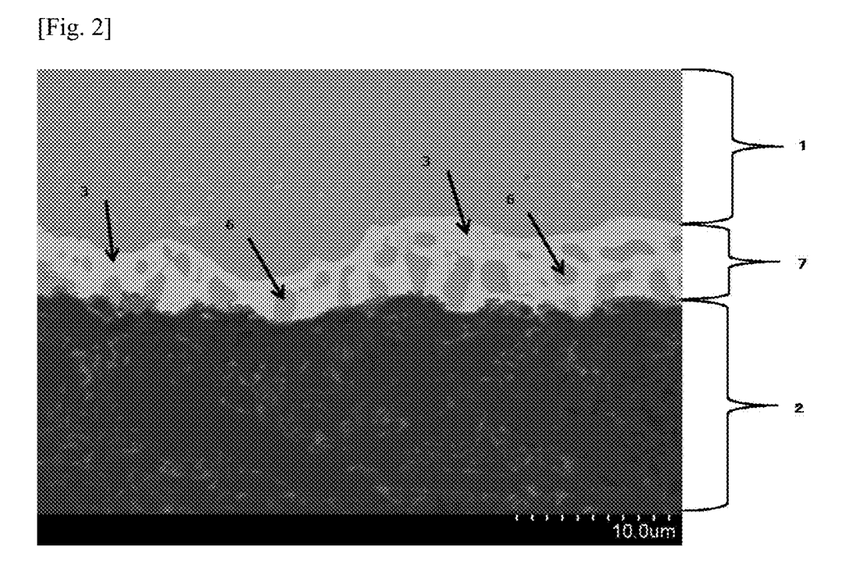
FIG. 2 shows an enlarged photograph for explaining Ag-rich phases and Cu-rich phases.

The ceramic circuit substrate has a protruding portion formed thereon by the braze material layer protruding from the outer edge of the circuit pattern. The protruding portion is described with reference to FIGS. 1 and 2. FIG. 1 shows an enlarged photograph of a bonding cross section in one example of a ceramic circuit substrate according to the present embodiment. This ceramic circuit substrate has a circuit pattern (copper circuit portion) 1 formed on a ceramic substrate (silicon nitride substrate) 2, with a braze material layer 7 interposed therebetween. A portion of the braze material layer 7 protrudes from the outer edge of the circuit pattern 1 and forms a protruding portion 4.

In the ceramic circuit substrate, the thickness of the braze material protrusion is 8 µm to 30 µm and the length thereof is 40 µm to 150 µm. Preferably, the thickness of the braze material protrusion is 13 µm to 23 µm and the length of the protrusion is 50 µm to 100 µm. By setting the thickness of the braze material protrusion to be 8 µm or more and the length thereof to be 40 µm or more, stress relaxation effects due to the braze material layer can be sufficiently exhibited and the thermal cycling properties can be further enhanced. Further, by setting the braze material thickness to be 30 µm or less, generation of large thermal stress is prevented thereby enabling the thermal cycling properties to be kept from being reduced. By setting the length of the braze material protrusion to be 150 µm or less, it is also possible to configure the outer dimensions of a substrate so as to be an acceptable size for design even given the recent market trends demanding products be made remarkably light, thin, short, and small.

(Ag-Rich Phases and Cu-Rich Phases)

The braze material layer has Ag-rich phases which are formed continuously for 300 µm or more, and preferably 400 µm or more, towards the inside, from the outer edge of the protruding portion, along the bonding interface between the ceramic substrate and the circuit pattern 1. "Ag-rich phases" means phases formed from an Ag solid solution and predominantly comprises Ag. "Predominantly" means being 80% or more as a quantitative analysis using an electron probe micro-analyzer (EPMA). The Ag-rich phases contain Sn or In and Ti, and Cu may be included as a solid solution. In the present embodiment, phases observed as a white color when observed using a scanning electron microscope are referred to as "Ag-rich phases" and phases observed as a black color are referred to as "Cu-rich phases". "Ag-rich phases formed continuously for 300 µm or more" means that phases observed as a white color when observed using a scanning electron microscope are formed over 300 µm continuously (without any breaks) from the braze material protruding portion outer edge. Explaining with reference to FIG. 2, the braze material layer 7 is configured from white-colored Ag-rich phases 3 and black-colored Cu-rich phases 6. Black-colored Cu-rich phases 6 may be included in the Ag-rich phases 3, but as long as the white-colored portion is not separated by any breaks, the meaning of "formed continuously" holds.

Figure 3:
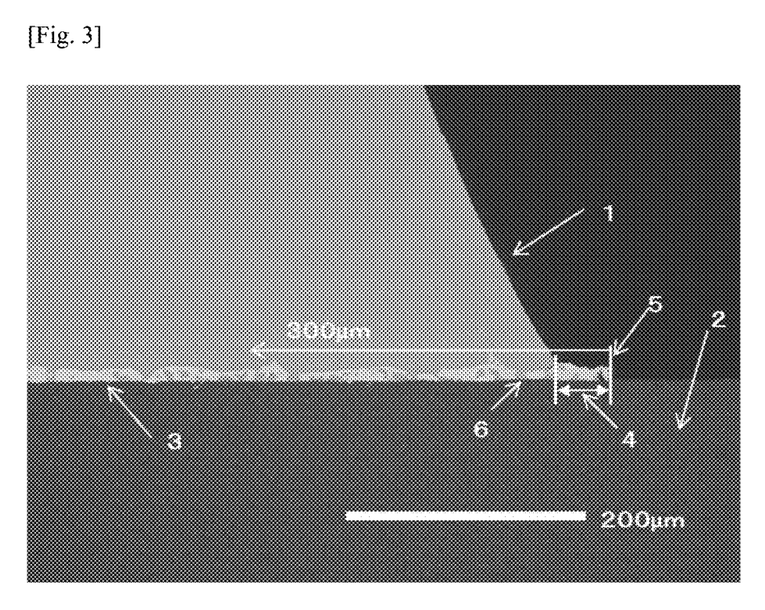
FIG. 3 shows an example of a cross-sectional photograph of a ceramic circuit substrate in which Ag-rich phases are not continuous for 300 μm or more, towards the inside of a circuit pattern, from an outer edge of a protruding portion formed by a braze material layer.

An explanation with reference to FIGS. 1 and 3 is now provided. In the ceramic circuit substrate of FIG. 1, the white-colored Ag-rich phases 3 are formed over at least 300 µm without any breaks therein. In FIG. 1, tiny black colors are observed in the white-colored Ag-rich phases, but the white-colored Ag-rich phases are formed continuously without being separated by any breaks. In contrast thereto, in the ceramic circuit substrate of FIG. 3, the white-colored Ag-rich phases are separated by a break at a location less than 100 µm from a braze material protruding portion outer edge 5, and a location configured from Cu-rich phases 6 alone appears (an Ag-rich phase broken portion).

In the present embodiment, the Ag-rich phases 3 are formed continuously for 300 µm or more from the braze material protruding portion outer edge 5 and therefore, even under the harsher conditions of the thermal cycling tests, there is no breaking of the bonding interface between the Ag-rich phases and the Cu-rich phases near the braze material protruding portion (in a range of 300 µm or less from the protruding portion outer edge 5). As a result thereof, it is possible to configure a ceramic circuit substrate having excellent thermal cycling resistance properties.

EXAMPLES

Hereinafter, examples are provided to describe the present invention in further detail. However, the interpretation of the present invention is not limited to these examples.

Example 1

An active metal braze material containing 3.5 parts by mass of a titanium hydride powder (TCH-100, manufactured by Toho Technical Service Co., Ltd.) relative to 100 parts by mass, in total, of 89.5 parts by mass of an Ag powder (Ag-HWQ; average particle diameter D50: 2.5 µm; specific surface area: 0.4 m$^2$/g; manufactured by Fukuda Metal Foil & Powder Co., Ltd.), 9.5 parts by mass of a Cu powder (Cu-HWQ; average particle diameter D50: 3 μm; specific surface area: 0.4 m$^2$/g; manufactured by Fukuda Metal Foil & Powder Co., Ltd.), and 1.0 parts by mass of an Sn powder (Sn-HPN; average particle diameter D50: 3 μm; specific surface area: 0.1 m$^2$/g; manufactured by Fukuda Metal Foil & Powder Co., Ltd.), was coated, by a screen printing method, onto both main surfaces of a 0.32 mm-thick silicon nitride substrate, such that the coated amount was 8 mg/cm$^2$.

Thereafter, a circuit-forming metal plate was placed over one surface of the silicon nitride substrate and a heat dissipation plate-forming metal plate (both being C1020 oxygen-free copper plates having a thickness of 0.8 mm and a purity of 99.60%) was placed over the other surface, and these were bonded under conditions of 830° C. for 30 minutes in a vacuum of $1.0 \times 10^{-3}$ Pa or lower. An etching resist was printed on the bonded copper plates and the copper plates were etched with a cupric chloride solution to form a circuit pattern. Furthermore, the braze material layers and nitride layers were removed with an ammonium fluoride/hydrogen peroxide solution, and a protruding portion having a braze material protrusion length of 29 μm and a thickness of 5 μm was formed. In the plating step, a pre-treatment of degreasing and chemical polishing was performed and then an anti-corrosion treatment was carried out using a benzotriazole-based compound.

<Bonding Void Ratio>

The bonding void ratio of the ceramic circuit substrate was computed by measuring the area of bonding voids observed by an ultrasonic flaw detector (ES5000, manufactured by Hitachi Power Solutions Co., Ltd.) and dividing this value by the area of the copper circuit pattern.

<Judgment of Continuity of Ag-rich Phases in Braze Material Layer Portion>

The bond structure of a cross section inside the circuit pattern from the braze material protruding portion outer edge in the ceramic circuit substrate was observed in reflected-electron images using a scanning electron microscope (SU6600, manufactured by Hitachi High-Technologies Corporation), with phases observed as a white color in the braze material layer being defined as Ag-rich phases, and phases observed as a black color being defined as Cu-rich phases. In observations, the continuity of the Ag-rich phases was confirmed by observing the inside of the circuit pattern from the braze material protruding portion outer edge in four fields of view at a 200-times magnification, the fields or view being 400 μm long and 600 μm wide. Those in which Ag-rich phases were all continuous were deemed to be "Good", and those having Ag-rich phases which were non-continuous even in only one field of view were deemed to be "Poor". The braze material protruding portion outer edge at that time was defined as being the outermost portion of the bond between the Ag-rich phases and the ceramic.

<Measurement of Thickness and Length of Braze Material Layer>

The braze material protruding portion in a cross section of a circuit pattern corner section in the ceramic circuit substrate was observed in reflected-electron images using a scanning electron microscope (SU6600, manufactured by Hitachi High-Technologies Corporation) in five fields of view at a 200-times magnification, the fields of view being 400 μm long and 600 μm wide. For the thickness of the braze material layer, an average of the maximum thickness and the minimum thickness for each field of view was determined, and the average value of the five fields of view was deemed to be the thickness of the braze material layer. For the length of the braze material protruding portion, a distance between the copper circuit pattern outer edge and the braze material protruding portion outer edge was determined for each field of view, and the average value of the five fields of view was deemed to be the length of the braze material layer.

<Evaluation of Thermal Cycling Resistance Properties>

A fabricated ceramic circuit substrate was repeatedly tested over 2,500 cycles in thermal cycling resistance tests wherein each cycle involved setting the temperature so as to change between −55° C. for 15 minutes, 25° C. for 15 minutes, 175° C. for 15 minutes, and 25° C. for 15 minutes. Thereafter, the metal plate and the braze material layer were stripped with iron chloride and an ammonium fluoride/hydrogen peroxide etching solution, and the area of cracks generated at the surface of the ceramic substrate was computed by using a scanner to input an image at a resolution of 600 dpi×600 dpi, using the image analysis software GIMP2 (threshold value 140) to digitize the image, and then computing the crack area. This was divided by the copper circuit pattern area to determine the crack ratio.

<Overall Judgment Criteria>

Those in which the bonding void ratio was 1.0% or lower and the crack ratio was 0.0 to 1.0% were graded 4; those in which the bonding void ratio was 1.0% or lower and the crack ratio was 1.1 to 1.5% were graded 3; those in which the bonding void ratio was 1.0% or lower and the crack ratio was 1.6 to 2.0% were graded 2; and those in which the bonding void ratio was higher than 1.0% or the crack ratio was higher than 2.0% were graded 1. The results are shown in Table 3.

Examples 2 to 4

Using the blend of the braze material and bonding conditions shown in Table 1, ceramic circuit substrates were produced in the same manner as in Example 1 with the exception that the length and thickness of the protruding portion were set as in Table 3. Further, the various kinds of measurements and evaluations were carried out in the same manner as in Example 1. The results are shown in Table 3.

Example 5

Using, in the braze material used for bonding, In powder (atomization process special grade reagent) instead of the Sn powder and setting the braze material blend and bonding conditions shown in Table 1, ceramic circuit substrates were obtained in the same manner as in Example 1 with the exception that the length and thickness of the protruding portion were set as in Table 3. The various kinds of measurements and evaluations were also carried out in the same manner as in Example 1. The results are shown in Table 3.

Examples 6 to 10

Using the blend of the braze material and bonding conditions shown in Table 1, ceramic circuit substrates were obtained in the same manner as in Example 1 with the exception that the length and thickness of the protruding portion were set as in Table 3. The various kinds of measurements and evaluations were also carried out in the same manner as in Example 1. The results are shown in Table 3.

Example 11

Using the blend of the braze material and bonding conditions shown in Table 1, ceramic circuit substrates were obtained in the same manner as in Example 5 with the exception that the length and thickness of the protruding portion were set as in Table 3. The various kinds of measurements and evaluations were also carried out in the same manner as in Example 5. The results are shown in Table 3.

Examples 12 to 14

Using the blend of the braze material and bonding conditions shown in Table 1, ceramic circuit substrates were obtained in the same manner as in Example 1 with the exception that the length and thickness of the protruding portion were set as in Table 3. The various kinds of measurements and evaluations were also carried out in the same manner as in Example 1. The results are shown in Table 3.

Example 15

Using the blend of the braze material and bonding conditions shown in Table 1, ceramic circuit substrates were produced in the same manner as in Example 5 with the exception that the length and thickness of the protruding portion were set as in Table 3. The various kinds of measurements and evaluations were also carried out in the same manner as in Example 5. The results are shown in Table 3.

Comparative Example 1

Ceramic circuit substrates were obtained in the same manner as Example 1 with the exception that Sn powder was not used in the braze material used for bonding, the braze material blend and bonding conditions shown in Table 2 were set, and the length and thickness of the protruding portion were set as in Table 4. The various kinds of measurements and evaluations were also carried out in the same manner as in Example 1. The results are shown in Table 4.

Comparative Example 2

Ceramic circuit substrates were obtained in the same manner as in Example 5 with the exception that the braze material blend and bonding conditions shown in Table 2 were used, and the length and thickness of the protruding portion were set as in Table 4. The various kinds of measurements and evaluations were also carried out in the same manner as in Example 5. The results are shown in Table 4.

Comparative Example 3

Ceramic circuit substrates were obtained in the same manner as in Example 5 with the exception that the braze material blend and bonding conditions shown in Table 2 were used, and the length and thickness of the protruding portion were set as in Table 4. The various kinds of measurements and evaluations were also carried out in the same manner as in Example 5. The results are shown in Table 4.

Comparative Examples 4-8

Other than the portions indicating changes in Tables 2 and 4, the same procedure as in Example 1 was performed. The results are shown in Table 4.

Comparative Example 9

Ceramic circuit substrates were obtained in the same manner as in Example 5 with the exception that the braze material blend and bonding conditions shown in Table 2 were used, and the length and thickness of the protruding portion were set as in Table 4. The various kinds of measurements and evaluations were also carried out in the same manner as in Example 5. The results are shown in Table 4.

Comparative Examples 10-14

Ceramic circuit substrates were obtained in the same manner as in Example 1 with the exception that the braze material blend and bonding conditions shown in Table 2 were used, and the length and thickness of the protruding portion were set as in Table 4. The various kinds of measurements and evaluations were also carried out in the same manner as in Example 1. The results are shown in Table 4.

TABLE 1

| | Braze material blend | | | | | Bonding conditions | |
|---|---|---|---|---|---|---|---|
| | Ag (parts by mass) | Cu (parts by mass) | Sn (parts by mass) | In (parts by mass) | $TiH_2$ (parts by mass) | Bonding temperature (°C.) | Retention time (minutes) |
| Example 1 | 89.5 | 9.5 | 1.0 | — | 3.5 | 830 | 30 |
| Example 2 | 88.5 | 9.5 | 2.0 | — | 3.5 | 830 | 30 |
| Example 3 | 89.5 | 9.5 | 1.0 | — | 3.5 | 860 | 30 |
| Example 4 | 89.5 | 9.5 | 1.0 | — | 3.5 | 830 | 30 |
| Example 5 | 89.0 | 9.5 | — | 1.5 | 3.5 | 825 | 30 |
| Example 6 | 89.5 | 9.5 | 1.0 | — | 3.5 | 830 | 30 |
| Example 7 | 89.5 | 9.5 | 1.0 | — | 3.5 | 830 | 30 |
| Example 8 | 89.5 | 9.5 | 1.0 | — | 3.5 | 830 | 30 |
| Example 9 | 93.0 | 5.5 | 1.5 | — | 3.5 | 810 | 40 |
| Example 10 | 85.0 | 13.0 | 2.0 | — | 3.5 | 800 | 30 |
| Example 11 | 85.0 | 13.0 | — | 2.0 | 3.5 | 800 | 30 |
| Example 12 | 89.5 | 9.5 | 1.0 | — | 3.5 | 860 | 60 |
| Example 13 | 89.5 | 9.5 | 1.0 | — | 3.5 | 890 | 30 |
| Example 14 | 90.0 | 9.5 | 0.5 | — | 3.5 | 840 | 30 |
| Example 15 | 90.0 | 9.5 | — | 0.5 | 3.5 | 830 | 30 |

TABLE 2

| | Braze material blend | | | | | Bonding conditions | |
|---|---|---|---|---|---|---|---|
| | Ag (parts by mass) | Cu (parts by mass) | Sn (parts by mass) | In (parts by mass) | TiH$_2$ (parts by mass) | Bonding temperature (° C.) | Retention time (minutes) |
| Comparative Example 1 | 90.0 | 10.0 | — | — | 3.5 | 850 | 30 |
| Comparative Example 2 | 88.5 | 8.5 | 3.0 | — | 3.5 | 830 | 30 |
| Comparative Example 3 | 88.5 | 8.5 | — | 3.0 | 3.5 | 830 | 30 |
| Comparative Example 4 | 68.0 | 30.0 | 2.0 | — | 3.5 | 830 | 30 |
| Comparative Example 5 | 89.5 | 9.5 | 1.0 | — | 3.5 | 950 | 30 |
| Comparative Example 6 | 89.5 | 9.5 | 1.0 | — | 3.5 | 870 | 240 |
| Comparative Example 7 | 98.0 | 1.0 | 1.0 | — | 3.5 | 830 | 30 |
| Comparative Example 8 | 89.9 | 10.0 | 0.1 | — | 3.5 | 830 | 30 |
| Comparative Example 9 | 89.9 | 10.0 | — | 0.1 | 3.5 | 830 | 30 |
| Comparative Example 10 | 89.5 | 9.5 | 1.0 | — | 1.0 | 835 | 35 |
| Comparative Example 11 | 89.5 | 9.5 | 1.0 | — | 7.0 | 835 | 40 |
| Comparative Example 12 | 89.5 | 9.5 | 1.0 | — | 3.5 | 780 | 50 |
| Comparative Example 13 | 89.5 | 9.5 | 1.0 | — | 3.5 | 950 | 30 |
| Comparative Example 14 | 89.5 | 9.5 | 1.0 | — | 3.5 | 830 | 5 |

TABLE 3

| | Evaluation results | | | | | |
|---|---|---|---|---|---|---|
| | Braze material | | | | | |
| | Continuity of Ag-rich phases | Protrusion length (μm) | Protrusion thickness (μm) | Bonding void ratio (area %) | Horizontal crack ratio (area %) | Overall judgment |
| Example 1 | Good | 29 | 5 | 0.9 | 1.8 | 2 |
| Example 2 | Good | 25 | 6 | 0.8 | 1.9 | 2 |
| Example 3 | Good | 45 | 5 | 0.7 | 1.3 | 3 |
| Example 4 | Good | 77 | 5 | 0.7 | 1.1 | 3 |
| Example 5 | Good | 31 | 26 | 0.3 | 1.4 | 3 |
| Example 6 | Good | 63 | 15 | 0.6 | 0.3 | 4 |
| Example 7 | Good | 91 | 10 | 0.8 | 0.2 | 4 |
| Example 8 | Good | 63 | 28 | 0.8 | 0.2 | 4 |
| Example 9 | Good | 67 | 16 | 0.5 | 0.8 | 4 |
| Example 10 | Good | 69 | 17 | 0.1 | 0.7 | 4 |
| Example 11 | Good | 66 | 16 | 0.1 | 0.7 | 4 |
| Example 12 | Good | 72 | 15 | 0.2 | 0.9 | 4 |
| Example 13 | Good | 61 | 22 | 0.2 | 0.8 | 4 |
| Example 14 | Good | 142 | 21 | 0.1 | 0.1 | 4 |
| Example 15 | Good | 121 | 18 | 0.1 | 0.1 | 4 |

TABLE 4

| | Evaluation results | | | | | |
|---|---|---|---|---|---|---|
| | Braze material | | | | | |
| | Continuity of Ag-rich phases | Protrusion length (μm) | Protrusion thickness (μm) | Bonding void ratio (area %) | Horizontal crack ratio (area %) | Overall judgment |
| Comparative Example 1 | Good | 49 | 12 | 3.1 | 0.9 | 1 |
| Comparative Example 2 | Poor | 63 | 10 | 0.3 | 2.1 | 1 |

TABLE 4-continued

| | Evaluation results | | | | | |
|---|---|---|---|---|---|---|
| | Braze material | | | | | |
| | Continuity of Ag-rich phases | Protrusion length (μm) | Protrusion thickness (μm) | Bonding void ratio (area %) | Horizontal crack ratio (area %) | Overall judgment |
| Comparative Example 3 | Poor | 64 | 10 | 0.4 | 2.3 | 1 |
| Comparative Example 4 | Poor | 51 | 10 | 0.3 | 8.4 | 1 |
| Comparative Example 5 | Poor | 45 | 5 | 0.0 | 6.1 | 1 |
| Comparative Example 6 | Poor | 27 | 5 | 0.2 | 3.5 | 1 |
| Comparative Example 7 | Good | 45 | 15 | 2.8 | 0.4 | 1 |
| Comparative Example 8 | Good | 48 | 13 | 2.5 | 0.7 | 1 |
| Comparative Example 9 | Good | 47 | 13 | 2.6 | 0.8 | 1 |
| Comparative Example 10 | Good | 54 | 12 | 5.7 | 0.7 | 1 |
| Comparative Example 11 | Poor | 50 | 12 | 0.1 | 3.5 | 1 |
| Comparative Example 12 | Good | 52 | 13 | 12.0 | 0.8 | 1 |
| Comparative Example 13 | Poor | 55 | 10 | 0.1 | 4.3 | 1 |
| Comparative Example 14 | Good | 62 | 9 | 15.7 | 0.9 | 1 |

As shown in Table 3, in bonded bodies comprising, in the braze material thereof, 85.0 to 95.0 parts by mass of Ag, 5.0 to 13.0 parts by mass of Cu, 1.5 to 5.0 parts by mass of Ti, and 0.4 to 2.0 parts by mass of Sn or In, and produced at a bonding temperature of 770 to 900° C. and for a retention time of 10 to 60 minutes, the Ag-rich phases were continuous for 300 μm or more, towards the inside of the circuit pattern, from the outer edge of the protruding portion formed by the braze material layer, and the crack ratio after thermal cycling tests was 2.0% or less. Furthermore, it was confirmed that by satisfying either of the conditions of the thickness of the braze material protruding portion being 8 to 30 μm and the length of the braze material protruding portion being 40 to 150 μm, the crack ratio becomes 1.5% or less, and by satisfying both of the foregoing conditions, the crack ratio becomes 1.0% or less.

REFERENCE SIGNS LIST

1 Circuit pattern
2 Ceramic substrate
3 Ag-rich phase
4 Braze material protruding portion
5 Braze material protruding portion outer edge
6 Cu-rich phase
7 Braze material layer

The invention claimed is:

1. A ceramic circuit substrate comprising:
a circuit pattern provided on a ceramic substrate having two main surfaces,
a braze material layer interposed between the circuit pattern and the ceramic substrate, and
a protruding portion formed by the braze material layer protruding from an outer edge of the circuit pattern, wherein:
the braze material layer comprises:
85.0 to 95.0 parts by mass of Ag;
5.0 to 13.0 parts by mass of Cu;
0.4 to 2.0 parts by mass of Sn or In; and
1.5 to 5.0 parts by mass of Ti,
relative to 100 parts by mass, in total, of the Ag, Cu, and Sn or In, and
Ag-rich phases are formed continuously for 300 μm or more, towards an inside of the circuit pattern, from an outer edge of the protruding portion along a bonding interface between the ceramic substrate and the circuit pattern, and the bonding void ratio is 1.0% or less.

2. The ceramic circuit substrate as in claim 1, wherein the protruding portion has a thickness of 8 to 30 μm and a length of 40 to 150 μm.

3. The ceramic circuit substrate as in claim 1, wherein the ceramic substrate is selected from silicon nitride, aluminum nitride, aluminum oxide, zirconium oxide, silicon carbide, and lanthanum boride.

4. The ceramic circuit substrate as in claim 1, wherein the circuit pattern comprises copper.

5. A production method for the ceramic circuit substrate as in claim 1, the production method comprising:
bonding, using a braze material, a copper plate onto both of the two main surfaces of the ceramic substrate,
wherein the bonding is carried out in a vacuum or an inert atmosphere at a bonding temperature of 770° to 900° C. and for a retention time of 10 to 60 minutes.

6. The method as in claim 5, wherein the braze material comprises Ag powder, Cu powder, and Sn powder or In powder, and the Ag powder has a specific surface area of 0.1 to 0.6 m$^2$/g.

7. The production method as in claim 6, wherein the Cu powder has a surface area of 0.1 to 1.0 m$^2$/g and an average particle diameter D50 of 0.8 to 8.0 μm.

8. The production method as in claim 6, wherein the Sn powder or the In powder has a specific surface area of 0.1 to 1.0 m²/g and an average particle diameter D50 of 0.8 to 10.0 μm.

* * * * *